United States Patent [19]

Herrin

[11] 4,157,466
[45] Jun. 5, 1979

[54] CRYSTAL OVEN FOR MAINTAINING CRYSTALS AT A PREDETERMINED TEMPERATURE

[76] Inventor: James R. Herrin, 3524 Bagley Ave. North, Seattle, Wash. 98103

[21] Appl. No.: 929,800

[22] Filed: Jul. 31, 1978

[51] Int. Cl.² .............................................. H05B 1/00
[52] U.S. Cl. .................................... 219/210; 310/343
[58] Field of Search ................ 219/210, 510; 310/343

[56] References Cited

U.S. PATENT DOCUMENTS

| | | | |
|---|---|---|---|
| 2,915,653 | 12/1959 | Mann | 219/210 X |
| 2,938,099 | 5/1960 | Cheli | 219/210 |
| 3,002,117 | 9/1961 | Vogt | 219/210 X |
| 3,252,109 | 5/1966 | White | 219/210 X |

*Primary Examiner*—C. L. Albritton
*Attorney, Agent, or Firm*—Christensen, O'Connor, Johnson & Kindness

[57] ABSTRACT

A crystal oven for radio frequency control crystals includes a crystal socket board, mounted directly on one side of a printed circuit board. The crystal sockets extend through and are soldered to corresponding cyrstal socket terminals on the opposite side of the printed circuit board. A housing surrounds the crystal socket board and is attached to the printed circuit board. An oven temperature control circuit including a power transistor controls the amount of current flowing through a heating wire, which is wrapped around and mounted to the housing. The collector plate of the power transistor is mounted to a heat sink, which overlies the crystal socket terminals. Heat generated by the collector plate as a result of current through the power transistor is distributed across the heat sink and is transferred by convection to the crystal socket terminals to reduce the amount of heat transfer through the crystal socket terminals.

9 Claims, 4 Drawing Figures

CRYSTAL OVEN FOR MAINTAINING CRYSTALS AT A PREDETERMINED TEMPERATURE

BACKGROUND OF THE INVENTION

This invention is directed to crystal ovens for maintaining radio frequency control crystals at a predetermined temperature.

By government regulation, radio transmitters are required to hold a precise center frequency, within very strict tolerances over a broad range of ambient temperatures, typically from −20° to 50° C. To meet these requirements, the operating temperature of the crystals used for frequency determination and stabilization in each radio transmitter must be maintained at a predetermined value within close tolerances.

The temperature of the crystals has been controlled through the use of crystal ovens. In broad terms, a crystal oven consists of the following components: (1) a housing, wherein the crystals are mounted in sockets; (2) heater wire wrapped around the exterior of the housing; (3) an oven temperature control circuit that adjustably controls the amount of current flowing through the heater wire as a function of the temperature sensed by the circuit; and (4) an electrical shield enclosing all of the components. The oven temperature control circuit typically includes a temperature sensor (such as a thermistor), a power transistor, resistors and control transistors. The output signal from the temperature sensor causes the oven temperature control circuit to vary current through the power transistor and thus through the heater wire to maintain the temperature of the crystal oven substantially constant.

To work effectively, the crystal oven must be configured to thermally isolate the crystal terminals from ambient temperature. Otherwise, heat will be transferred from the crystals to the environment surrounding the crystal oven by conduction, via electrical leads connected to the crystal socket terminals, and by convection. The heat transfer (in this case, cooling) will, in some environments, prevent maintenance of the crystal temperature within required tolerances.

Another problem associated with heat loss via the crystal socket terminals is that the crystal oven must be constantly and therefore inefficiently heating the crystals to compensate for the heat loss.

The prior art teaches a number of attempts to maximize thermal isolation of the crystals by physically isolating the crystal terminals from ambient temperature. Electrical leads typically connect one terminal of each crystal to a frequency control circuit within the radio but exterior to the crystal oven, and connect the other terminal of each crystal to a common ground. In order to minimize the heat transfer from the interior of the crystal oven to ambient as a result of thermal conduction through the crystal terminals and the associated electrical leads, the prior art discloses the following: the housing for the crystal terminals is positioned away from a thermally insulative board, typically made of Bake-O-Lite; the crystal socket terminals are maintained within the housing; the electrical leads have as small a cross-sectional diameter as possible; and, the electrical leads extend through very small openings in both the housing and the thermally insulative board. To achieve thermal isolation in this manner, prior art crystal ovens have been difficult to assemble and therefore expensive to manufacture. They are also generally unreliable. The small electrical leads extending from the crystal socket terminals are easily broken in shipment or installation, and repairing the broken leads is prohibitively expensive. Additionally, the electrical leads, after they extend through the thermally insulative board, resemble a mass of spaghetti; it is difficult to locate the correct lead from a particular crystal, and to connect that lead, once it is located, to another circuit.

Prior art crystal ovens also lose heat through their electrical shielding. In one prior art crystal oven, a ground plate is mounted to the side of the thermally insulative board opposite the crystal sockets, and is electrically connected to the ground leads coming from the crystal sockets. Since the ground plate is therefore exposed to the environment, its temperature substantially corresponds to ambient temperature and further increases heat transfer from the crystal oven.

In addition to heat generated by the heating wire, the power transistor of the oven temperature control circuit generates a considerable amount of heat which can be used to maintain the temperature of the crystals within tolerances. In some prior art crystal ovens, the collector of the power transistor is mounted on the crystal oven housing to aid in heating the crystals. However, mounting the power transistor on the housing in this manner concentrates a strong heat source at one location so that a temperature gradient is established within the crystal oven. Crystals located adjacent the power transistor may be operating at higher temperatures than crystals located away from the power transistor. Thus, the temperature of some of the crystals may not be maintained within the required tolerances.

Therefore, it is an object of this invention to provide a new and improved crystal oven that thermally isolates the crystal terminals from ambient temperature and is relatively easy and inexpensive to manufacture and maintain.

It is a further object of this invention to provide a new and improved crystal oven that evenly distributes heat throughout the entire crystal oven housing.

It is another object of this invention to provide a new and improved crystal oven that is reliable and that allows specific crystal terminals to be easily identified and easily connectable.

It is yet another object of this invention to provide a new and improved crystal oven which minimizes heat loss from the crystal oven housing through the electrical shielding surrounding the housing.

It is still another object of this invention to provide a new and improved crystal oven that operates more efficiently than prior art crystal ovens.

SUMMARY OF THE INVENTION

A crystal oven of this invention includes a board of electrically insulated material, a housing, a plurality of crystal sockets, a heating wire, an oven temperature control circuit including a semiconductor having a plate-like member, a plurality of crystal socket terminations, a heat sink and a mechanism for thermally conductively securing the plate-like member of the semiconductor to the heat sink. The board of electrically insulating material has first and second opposing surfaces. The housing is disposed in proximity to the first surface of the board. The plurality of crystal sockets are mounted within the housing. The heating wire is coiled about the housing and the oven temperature control circuits are electrically interconnected with the heating wire and is responsive to the temperature within the housing for controlling the amount of current flowing through the heating wire. The plurality of crystal socket terminals are located on the second surface of the board and electrically connected with the plurality of crystal sockets. The heat sink is supported in proximity to the second surface of the board so as to be separated from but to overlie the plurality of crystal socket terminals. When the plate-like member of the semiconductor device is thermally conductively secured to the heat sink, heat generated by the plate-like member, as a result of current through the semiconductor, is conductively distributed to the heat sink to heat the plurality of crystal socket terminals and to thereby reduce heat transfer from the housing through the plurality of crystal socket terminals.

In accordance with other aspects of this invention, the plate-like member of the semiconductor device is electrically insulated from the heat sink and the heat sink is electrically connected to a source of ground potential whereby the heat sink is capable of functioning as an electrical shield for the plurality of crystal socket terminals.

It will be appreciated from the foregoing brief summary that the invention comprises a crystal oven that effectively thermally isolates the crystal socket terminals from ambient temperatures. The heat sink acts as a thermal barrier against heat loss from the housing through the plurality of crystal socket terminals. Furthermore, by connecting the heat sink with a souce of ground potential, the heat sink becomes an effective electrical shield for the crystal socket terminals. The source of ground potential for the crystal oven is heated by the heat sink which prevents heat from being conducted from the crystals to ambient via the source of ground potential. Because the heat sink more effectively isolates the crystal socket terminals from ambient temperatures than do prior art devices, the heat generated by the heating wire dissipates from the crystal oven less rapidly and therefore temperature variations within the crystal oven are less dramatic. Less energy is required by the crystal oven to maintain the temperature of the crystals within required temperature tolerances. Moreover, by electrically connecting the crystal socket terminals to the electrically insulated board, the crystal oven of this invention is easy and inexpensive to manufacture and is highly reliable. The crystal socket terminals on the second surface of the electrically insulated board allows specific crystal terminals to be easily identified and easily connectable with other circuits.

BRIEF DESCRIPTION OF THE DRAWINGS

The foregoing objects and many of the attendant advantages of this invention will become more readily appreciated by reference to the following detailed description and the accompanying drawings herein.

DESCRIPTION OF THE PREFERRED EMBODIMENT

Figure 1:
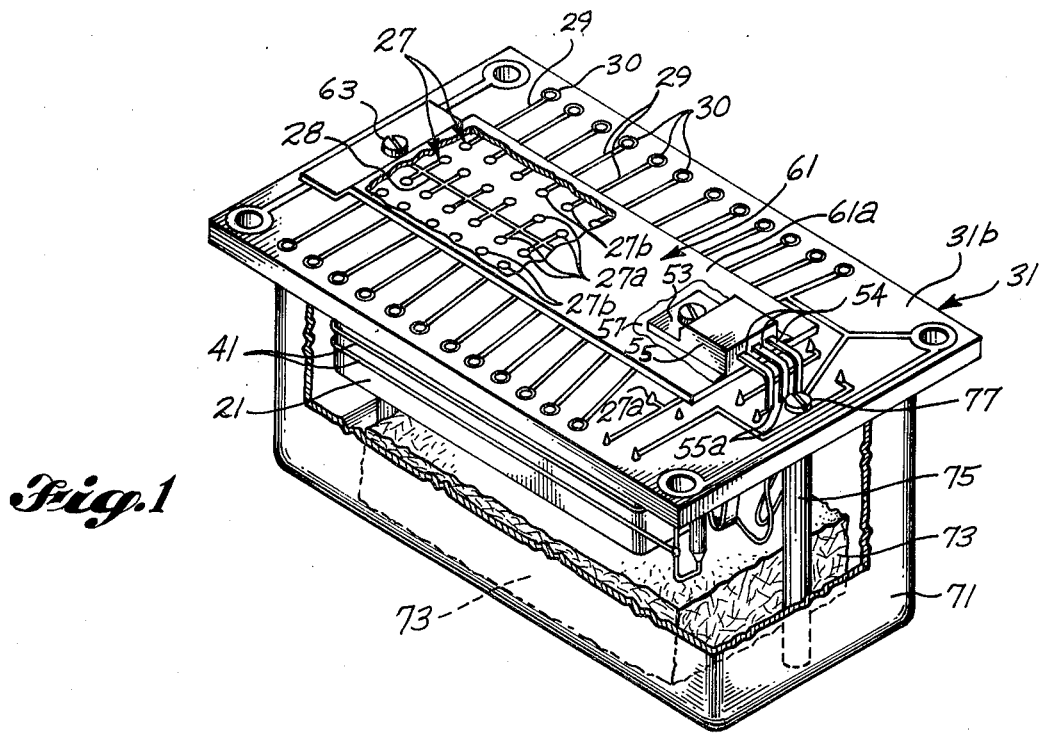
FIG. 1 is an isometric view of a crystal oven formed in accordance with this invention and specifically illustrates the heat sink.
Figure 2:
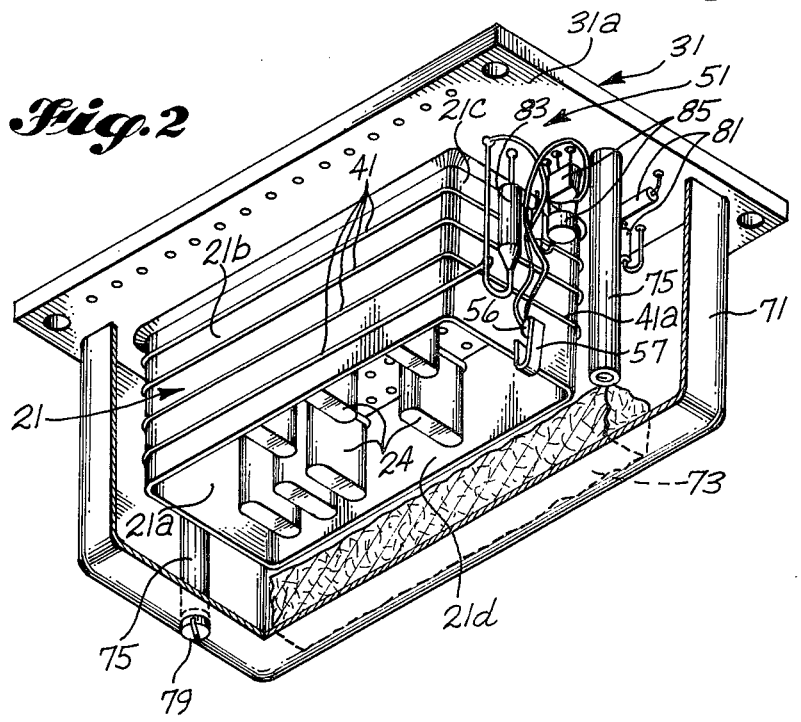
FIG. 2 is an isometric view of a crystal oven formed in accordance with this invention and illustrates the crystal housing and the oven temperature control circuit.
Figure 3:
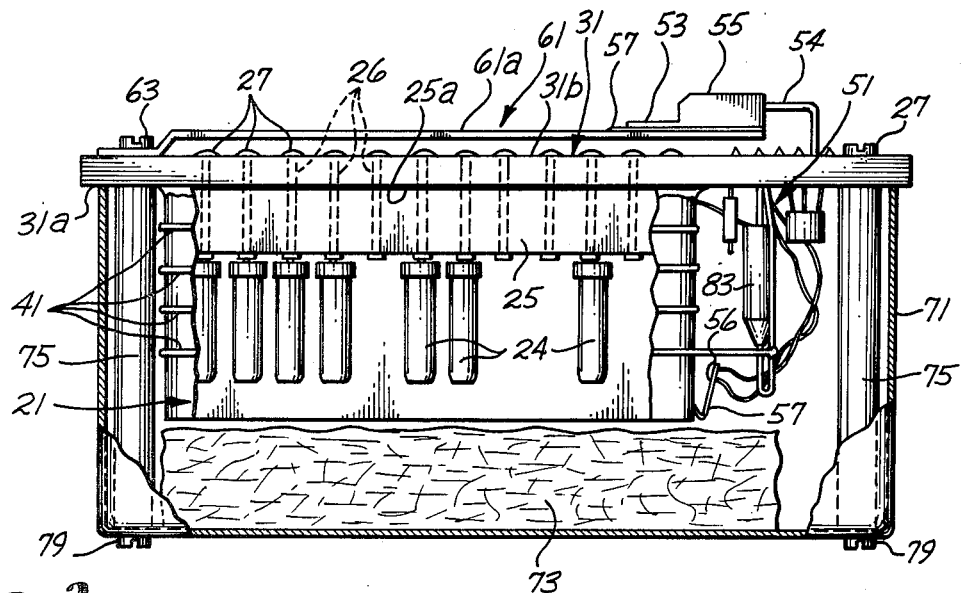
FIG. 3 is a side elevation view of a crystal oven formed in accordance with this invention.

The crystal oven forming the preferred embodiment of this invention, as illustrated in FIGS. 1 through 3, generally includes a crystal housing 21, a crystal socket board 25, a printed circuit board 31, heating wire 41, an oven temperature control circuit 51, a heat sink 61 and an electrical shielding enclosure 71. A collector plate 53 of a power transistor 55, which forms part of the oven temperature control circuit 51, is mounted directly to the heat sink 61. When the oven temperature control circuit 51 is energized, heat is generated by the power transistor 55 and is distributed over the heat sink 61 to resist conduction and convection cooling of the crystal socket terminals 27 caused by ambient temperatures.

Radio frequency control crystals 24 are mounted within crystal sockets 26 in the electrically insulative crystal socket board 25. The bottom surface 25a of the crystal socket board 25 abuts the inner surface 31a of the standard glass epoxy printed circuit board 31. Crystal sockets 26 projecting from the bottom surface 25a of the crystal socket board 25 extend through corresponding openings in the printed circuit board 31. The crystal sockets 26 project slightly beyond the outer surface 31b of the printed circuit board 31 and are soldered to crystal socket terminals 27 formed on the outer surface 31b. See FIGS. 1 and 3. If necessary, the ends of the projecting portions of the crystal sockets 26 are cut to avoid contact with the heat sink. Referring now to FIG. 1, the crystal socket terminals 27 for each crystal include a ground terminal 27a and an active terminal 27b, both of which are located orthogonally to the longitudinal centerline of the printed circuit board 31. The ground terminals 27a are adjacent to and form linear rows that are parallel with this longitudinal centerline. A common ground electrical lead 28 extends along the longitudinal centerline, with each ground terminal 27a being electrically connected to the ground lead 28. The active terminals 27b are spaced apart from the ground lead 28 and form linear rows of terminals that are parallel with the longitudinal centerline. The active terminals 27b are electrically connected by leads 29 to corresponding point 30 on the perimeter of the printed circuit board 31. A frequency control circuit associated with each crystal may be easily connected to that crystal by merely connecting an electrical lead to the appropriate connecting point 30 on the printed circuit board 31. The crystal socket terminals 27, ground lead 28, leads 29 and connecting points 30 are formed as a conducting layer in the required pattern on surface 31b of printed circuit board 31 by any typical printed circuit board fabrication technique.

The heat sink 61 preferably comprises an elongate metallic plate whose longitudinal centerline is aligned with that of the printed board 31 and whose length and width are such that the heat sink 61 overlies all of the crystal socket terminals 27. The heat sink 61 is attached to one end of the printed circuit board 31 by a screw 63 which in turn is received within spacer sleeve 75. Both the heat sink 61 and the screw 63 contact the ground lead 28. As best viewed in FIG. 3, from its point of attachment to the printed circuit board 31, the heat sink 61 inclines away from the printed circuit board 31 toward the crystal socket terminals 27, and then extends over the terminals 27 parallel with the outer surface 31b of the printed circuit board 31. The collector plate 53 of power transistor 55 is centrally mounted on the outer surface of the other end of the heat sink 61 opposite screw 63. The collector plate 53 is bonded to the heat sink 61 by thin layer 57 of an electrically insulative, thermally conductive epoxy. Three electrical leads (collectively designated 54) of the power transistor 55 extend to and are soldered to corresponding terminals 55a on the printed circuit board 31, and assist in supporting and maintaining the heat sink 61 in a fixed, spaced relationship with respect to the outer surface 31b of the printed circuit board 31.

When the oven temperature control circuit 51 is energized to heat the crystal oven housing 21, the collector plate 53 generates a considerable amount of heat which is conducted to and distributed over the heat sink 61. The crystal socket terminals 27, ground lead 28 and electrical leads 29 are heated by the heat sink 61 by convection via the air between the heat sink 61 and the printed circuit board 31. The ground terminals 27a of the crystal socket terminals 27, all ground leads, and all components of the crystal oven electrically connected to the ground leads, are heated by the heat sink 61 by conduction. In this manner, the heat sink 61 effectively isolates the crystal socket terminals 27 from ambient temperatures and permits the crystal oven to operate more effectively and efficiently. By electrically insulating the heat sink 61 from the power transistor 55, and by connecting the heat sink 61 with ground lead 28, the heat sink 61 acts as an electric shield for the terminals 27 to prevent electromagnetic radiation from other components within the radio from affecting the operation of the crystals.

The average temperature within the housing 21 is maintained as required by heat produced by the heating wire 41, which is wrapped about and electrically insulated from the external surfaces of the crystal housing 21, under control of the oven temperature control circuit 51. As shown in FIGS. 2 and 3, the thermally conductive metal housing 21 has four sides 21a, 21b, 21c and 21d which surrounds the crystal socket board 25 and crystals 24. A top (not shown in the drawings) is press-fitted to the top of the sides of the housing 21 and covers the crystals 24 and crystal socket board 25. The surface of the housing 21 abutting the inner surface 31a of the printed circuit board 31 is continuously soldered to a conducting layer on the inner surface 31a. This conducting layer is electrically connected to terminal 27a on the outer surface 31b, which is electrically connected to ground lead 28. The heating wire 41 is wrapped around the crystal housing 21 approximately four times. The vertical spacing between segments of the heating wire 41 is approximately equidistant to ensure even distribution of the heat generated by the heating wire through the housing 21.

The oven temperature control circuit 51 includes a temperature sensor or thermistor 56, resistors 81, temperature limit switch 83, silicon transistors 85 and the power transistor 55. The location and configuration of the power transistor has been described above. The temperature limit switch 83, silicon transistor 85 and resistors 81 are located adjacent side 21c of the housing 21, and their corresponding electrical heads extend through corresponding openings in the printed circuit board 31 and are soldered to terminals on the outer surface 31b. The terminals of the temperature limit switch 83, resistors 81, silicon transistor 85 and the power transistor 55 are connected by leads formed as a conducting layer in the required sequence on surface 31b of the printed circuit board 31; the terminals and leads associated with the silicon transistors 85 and resistors 81 are located on the printed circuit board 31 in close proximity to the heat sink 61 so that heat generated by the heat sink 61 ensures that the silicon transistors 85 and resistors 81 are operating within their temperature parameters. Although the temperature parameters for these components are not as strict as for the radio frequency control crystals, the resistors 81 and silicon transistors 85 must be heated to operate within specifications. The temperature limit switch 83 is spaced away from the heating wire 41 and positioned so as to sense a surrounding temperature that approximates the temperature with the housing 21.

Figure 4:
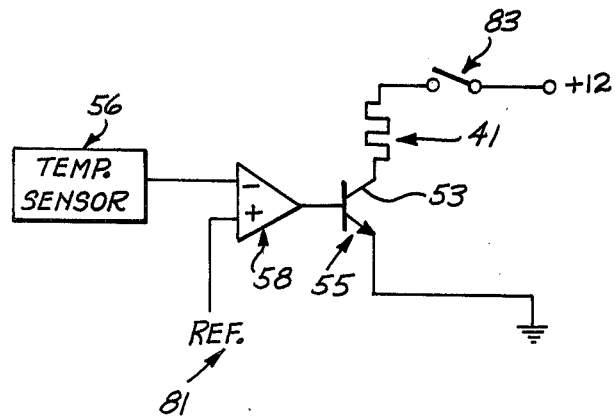
FIG. 4 is a schematic diagram of the oven temperature control circuit as known to the prior art.

Referring now to FIG. 4, one end of heater wire 41 is connected to the temperature limit switch 83 and the opposite end of heater wire 41 is connected to the terminal associated with the collector of the power transistor 55. The temperature limit switch 83 acts as a safety fuse in the oven temperature control circuit 51 and opens the circuit 51 if the circuit malfunctions and the temperature of the temperature limit switch 83 reaches 100° C. The resistors 81 and the silicon transistors 85 are interconnected in a well-known manner to function as an error amplifier 58. In operation, the error amplifier 58 compares a reference signal from the resistors 81 representing the desired crystal temperature with a signal from the thermistor 56 representing the actual crystal temperature to obtain an output signal proportional to the difference between the desired and actual crystal temperatures, which output signal proportionally controls the current through power transistor 55 and thus through heating wire 41 to maintain the crystal temperatures within tolerances. For example, if the actual temperature of the crystals decreases, the resistance of the thermistor 56 increases to decrease the signal supplied to error amplifier 58, as a result of which the output signal from error amplifier 58 increases to increase current through the power transistor and therefore through the heating wire 41 to increase the heat supplied to the housing 21.

The thermistor 56 is bonded to a thermally conductive metal clip 57 with a thermally conductive, electrically insulative epoxy. The clip 57 is centrally soldered to side 21c of the crystal housing 21 at the position farthest away from the inner surface 31a of the printed circuit board 31, and angles aways from side 21c and toward the printed circuit board 31. The thermistor 56 is positioned away from the crystal housing 21 and the heating wire 41 a predetermined distance so that the temperature registered by the thermistor 56 as a result of heat radiated by the heating wire 41 and the crystal housing 21 substantially corresponds to the temperature within the crystal housing 21 at the intersection of its longitudinal and lateral centerlines.

The electrical shield enclosure 71 completely covers both the crystal housing 21 and the components forming the oven temperature control circuit 51. A piece of thermal insulation 73 is bonded to the interior of the electrical shield enclosure 71 and is configured to cover the crystal housing 21 to prevent heat loss through the top of the crystal housing 21. The electrical shield enclosure 71 abuts the inner surface 31a of the printed circuit board 31 and is rigidly affixed to spacer sleeves 75 via screws 79. Screws 63 and 77 rigidly affix the spacer sleeves 75 to the printed circuit board 31, and electrically connect the sleeves 75 to the ground lead 28 in the printed circuit board 31.

In the crystal oven forming the preferred embodiment of this invention, the section 61a of the heat sink 61 (the section parallel with the printed circuit board 31) is spaced away from the outer surface 31b of the printed circuit board 31 approximately 1/12", and is also spaced away from the closest point of the crystal socket terminals approximately 1/16". See FIG. 3. The thermistor 56 is spaced away from side 21c of the crystal housing 21 approximately ⅛", and is spaced away from the section 41a of heating wire 41 farthest away from the inner surface 31a of the printed circuit board 31 approximately ⅜". See FIG. 2. The crystal socket board 25 and crystal sockets are obtainable as a unit from E. F. Johnson Co., Waseca, MN (Part 126-0110-005). The heating wire is 0.010NiCO single glass silicon binder insulated wire, obtainable from California Fine Wire Co., Gover City, CA. The temperature of the crystals 24 is maintained at 75° C.±1° C. over an ambient temperature range of −20° C. to 50° C. by the preferred embodiment.

While a preferred embodiment of the invention has been illustrated and described, it will be readily appreciated by those skilled in the art and others that various changes can be made herein without departing from the spirit and scope of the invention. For example, the crystal sockets 26 may not extend through the printed circuit board 31 and may be only electrically connected to the terminals 27 on the printed circuit board. Further, different types of current regulating semiconductors, having an electrode which produces heat as a function of current flow, may be used in lieu of power transistor 55. For example, current regulating or control diodes may be used. Hence, the invention can be practiced otherwise than as specifically described herein.

The embodiments of the invention in which an exclusive property or privilege is claimed are defined as follows:

1. In a crystal oven including: a board of electrically insulating material, said board having first and second, opposing surfaces; a housing disposed in proximity to said first surface of said board; a plurality of crystal sockets mounted within said housing; a heating wire coiled about said housing; and, an oven temperature control circuit, including a semiconductor device having a plate-like member electrically interconnected with a current-carrying terminal of said semiconductor device, which is electrically interconnected with said heating wire and which is responsive to the temperature within said housing, for controlling the amount of current flowing through said heating wire; the improvement comprising:

a plurality of crystal socket terminals located on said second surface of said board and electrically interconnected with said plurality of crystal sockets;

a heat sink supported in proximity to said second surface of said board so as to be separated from but to overlie said plurality of crystal socket terminals, and thermally conductive means securing said plate-like member of said semiconductor device to said heat sink, whereby heat generated by said plate-like member as a result of current through said semiconductor device is conductively distributed to said heat sink to heat said plurality of crystal socket terminals and to thereby reduce heat transfer from said housing through said plurality of crystal socket terminals.

2. The improvement as recited in claim 1, wherein said thermally conductive means also electrically insulates said plate-like member of said semiconductor device from said heat sink, and said improvement further comprising means for electrically interconnecting said heat sink with a source of ground potential, whereby said heat sink is capable of functioning as an electrical shield for said plurality of crystal socket terminals.

3. The improvement as recited in claim 1, wherein said semiconductor device comprises a power transistor, and wherein said plate-like member comprises a collector plate of said power transistor.

4. The improvement as recited in claim 1, said crystal oven further including a socket board of electrically insulating material located within said housing and having located therein said plurality of crystal sockets, each of said crystal sockets having a terminal portion projecting from said socket board; and wherein said improvement further comprises a plurality of apertures defined in said board and extending between said first and said second surfaces thereof, each of said plurality of apertures communicating with one of said plurality of crystal socket terminals, with one terminal portion being received in a corresponding one of said plurality of apertures and being electrically interconnected to a corresponding one of said plurality of crystal socket terminals.

5. The improvement as recited in claim 4, wherein said socket board abuts said first surface of said board in assembly.

6. The improvement as recited in claim 1, wherein said plurality of crystal socket terminals are arranged in a linear array on said second surface of said board, and wherein said heat sink comprises an elongated plate which is aligned with said linear array.

7. The improvement as recited in claim 6, wherein said plurality of crystal sockets includes an active crystal socket and a ground crystal socket, and wherein those ones of said plurality of crystal socket terminals that are electrically interconnected with said plurality of ground crystal sockets are aligned in a first row in said linear array, and wherein said plurality of crystal socket terminals that are electrically interconnected with said plurality of active crystal sockets are aligned in a second row in said linear array.

8. The improvement as recited in claim 7, further comprising a ground terminal located on said second surface of said board; first electrically conductive circuit means located on said second surface of said board and electrically interconnecting said plurality of crystal socket terminals in said first row with said ground terminal; a plurality of circuit interconnection terminals located on said second surface of said board; and, a plurality of second electrically conductive circuit means located on said second surface of said board and each electrically interconnecting one of said plurality of crystal socket terminals in said second row with one of said plurality of circuit interconnection terminals.

9. The improvement as recited in claim 1, wherein said semiconductor device has at least one semirigid terminal lead and wherein said plate-like member of said semiconductor device is secured to said heat sink at a first end thereof, said improvement further comprising: means securing a second end of said heat sink to said second surface of said board; at least one electrical terminal for said semiconductor device located on said second surface of said board; and, means bonding said at least one terminal lead of said semiconductor device to said at least one electrical terminal therefor.

* * * * *